United States Patent
Chen

(10) Patent No.: US 10,642,089 B2
(45) Date of Patent: May 5, 2020

(54) LIQUID CRYSTAL DISPLAY PANEL, LIQUID CRYSTAL DISPLAY APPARATUS AND METHOD FOR MANUFACTURING SAME

(71) Applicants: HKC Corporation Limited, Shenzhen (CN); Chongqing HKC Optoelectronics Technology Co.,Ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 176 days.

(21) Appl. No.: 15/757,371

(22) PCT Filed: Apr. 20, 2017

(86) PCT No.: PCT/CN2017/081220
§ 371 (c)(1),
(2) Date: Mar. 5, 2018

(87) PCT Pub. No.: WO2018/086312
PCT Pub. Date: May 17, 2018

(65) Prior Publication Data
US 2019/0339567 A1    Nov. 7, 2019

(30) Foreign Application Priority Data
Nov. 9, 2016 (CN) .......................... 2016 1 0985793

(51) Int. Cl.
*G02F 1/1335* (2006.01)
*G02F 1/13* (2006.01)
(Continued)

(52) U.S. Cl.
CPC ...... *G02F 1/133512* (2013.01); *G02F 1/1306* (2013.01); *G02F 1/1337* (2013.01); *G09G 3/3607* (2013.01)

(58) Field of Classification Search
CPC ............. G02F 1/133512; G02F 1/1306; G02F 1/1336; G02F 1/1333; G02F 1/1337;
(Continued)

(56) References Cited

U.S. PATENT DOCUMENTS

| 6,078,379 A | 6/2000 | Nagae et al. |
| 2002/0067450 A1 | 6/2002 | Moriya |

(Continued)

FOREIGN PATENT DOCUMENTS

| CN | 201754209 U | 3/2011 |
| CN | 103454803 A | 12/2013 |

(Continued)

OTHER PUBLICATIONS

Xiaofang Yu, the International Searching Authority written comments, Jul. 2018, CN.

(Continued)

*Primary Examiner* — Hoan C Nguyen

(57) ABSTRACT

The present disclosure provides a liquid crystal display panel, an liquid crystal display apparatus, and a method for manufacturing same. The liquid crystal display panel includes a substrate, a black matrix disposed on the substrate, an alignment layer disposed on the black matrix, and a groove disposed on the black matrix and arranged around the alignment layer, wherein the sealant is arranged on an outside of the groove, to prevent diffusion of the alignment layer according to feature of the groove, avoid overlap of the alignment layer and the sealant and improve the cell quality.

14 Claims, 3 Drawing Sheets

(51) Int. Cl.
*G02F 1/1337* (2006.01)
*G09G 3/36* (2006.01)
(58) Field of Classification Search
CPC ............ G02F 1/133514; G02F 1/1339; G02F 2202/22; G09G 3/3607; G09G 3/36
See application file for complete search history.

(56) References Cited

U.S. PATENT DOCUMENTS

2011/0255041 A1* 10/2011 Inoue ................ G02F 1/133723
349/123
2012/0300163 A1* 11/2012 Moriwaki ............. G02F 1/1337
349/123
2017/0017109 A1* 1/2017 Park .................. G02F 1/133512
2017/0052405 A1* 2/2017 Yu ........................ H05K 999/99

FOREIGN PATENT DOCUMENTS

| CN | 103984148 A | 8/2014 |
| CN | 105242445 A | 1/2016 |
| CN | 106054444 A | 10/2016 |

OTHER PUBLICATIONS

Xiaofang Yu, the ISA written comments, Jul. 2017, CN.
Xiaofang Yu, the International Search Report, Jul. 2017, CN.

* cited by examiner

LIQUID CRYSTAL DISPLAY PANEL, LIQUID CRYSTAL DISPLAY APPARATUS AND METHOD FOR MANUFACTURING SAME

TECHNICAL FIELD

The present disclosure relates to the field of display technology, and more particularly to a liquid crystal display panel, a liquid crystal display apparatus, and a method for manufacturing same.

BACKGROUND

Liquid crystal display (LCD) apparatuses have more advantages, such as thin body, power saving, no radiation, etc., and are widely used. In an existing market, most of the LCD apparatuses are backlit type LCD apparatuses, each including a liquid crystal display (LCD) panel and a backlight module. Operating principle of the LCD panel is that liquid crystal molecules are positioned between two substrates paralleled each other, and a driving voltage is applied to two substrates to control orientation of the liquid crystal molecules, to refract light rays of the backlight module to generate images.

Thin film transistor liquid crystal display (TFT-LCD) apparatuses currently maintain a leading status in the display field because of low power dissipation, good image quality, and high production yield, and other properties. The TFT-LCD apparatus includes a LCD panel and a backlight module. The LCD panel comprises a color filter (CF) substrate and a thin film transistor (TFT) substrate, and a transparency electrode inside relative to two substrates. A liquid crystal molecule layer is positioned between the two substrates. The LCD panel changes polarized state of the light by controlling orientation of the liquid crystal molecules through an electric field, for penetration and obstruction of a light path via a polarized plate to display.

In a manufacturing process for an existing substrate, the CF substrate is formed using some technologies, such as photoresist coating, exposure, development, indium thin oxide (ITO), photo spacer, etc. In the process of forming the CF substrate, an alignment material is injected to form an alignment layer, the alignment material is easy to expand and overlap with a sealant, further affecting a cell quality.

SUMMARY

The aim of the present disclosure is to provide a liquid crystal display (LCD) panel, to improve the cell quality.

The present disclosure further provides an LCD apparatus using the above LCD panel.

The aim of the present disclosure is achieved through a technical scheme as follow. The LCD panel comprises:
  a substrate;
  a black matrix disposed on the substrate;
  an alignment layer disposed on the black matrix; and
  a groove disposed on the black matrix and arranged around the alignment layer, wherein the sealant is arranged on an outside of the groove.

Furthermore, the groove penetrates through the black matrix, and a bottom of the groove is in contact with the substrate, and the processing technology is simple.

Furthermore, the alignment material is filled in the groove, and a shading layer is disposed on an opening of the groove. The bottom of the groove is in contact with the substrate, causing light leakage because of the groove penetrating through the black matrix, and needs to use the shading layer to shade light to avoid the light leakage.

Furthermore, the shading layer is a black sealant, which can be manufactured with manufacturing process of the sealant without additional equipment, further simplifying operation.

Furthermore, the groove is a blind groove. A bottom of the groove is in contact with the black matrix without additional shading process, which avoids light leakage, and saves manufacturing process and production time.

Furthermore, the groove is continuous and surrounds the alignment layer, which better limits the diffusion of the alignment material.

Furthermore, a number of the groove is at least two, and a plurality of the grooves are arranged around the alignment layer at intervals. A plurality of the grooves are arranged at the diffusion placement of the alignment material, preventing the diffusion of the alignment material. The groove does not have corners, which is easy to manufacture the groove and simplify process Furthermore, the black matrix comprises an inner region and an outer region, wherein the inner region is connected to the outer region through the groove, and the alignment layer is disposed on the inner region. A height of the outer region is greater than a height of the inner region. The alignment material is not easy to diffuse from the inner region to the outer region, which can prevent the diffusion of the alignment material, and avoids the overlap of the alignment material and the sealant.

The present disclosure further provides the LCD apparatus comprising the above the LCD panel.

The present disclosure further provides a method for manufacturing the LCD panel, and the above groove is formed on the black matrix using halftone mask process.

Compared with prior art, a technical effect of the present disclosure is that: the groove is the blind groove disposed on the black matrix. The groove is arranged around the alignment layer at intervals. The sealant is arranged on the outside of the groove, which prevents diffusion of the alignment layer according to the feature of the groove, avoids the overlap of the alignment layer and the sealant, improves cell quality, and precisely controls the alignment layer, further avoiding waste of alignment material forming the alignment layer, saving costs, and improving quality of the LCD panel.

BRIEF DESCRIPTION OF FIGURES

The drawings included are used for providing further understanding of embodiments of the present application, constitute part of the description, and are used for illustrating implementation manners of the present application, and interpreting principles of the present application together with text description. Apparently, the drawings in the following description are merely some embodiments of the present application, and for those ordinary skilled in the art, other drawings can also be obtained according to the drawings without contributing creative labor. In the drawings.

Figure 1:
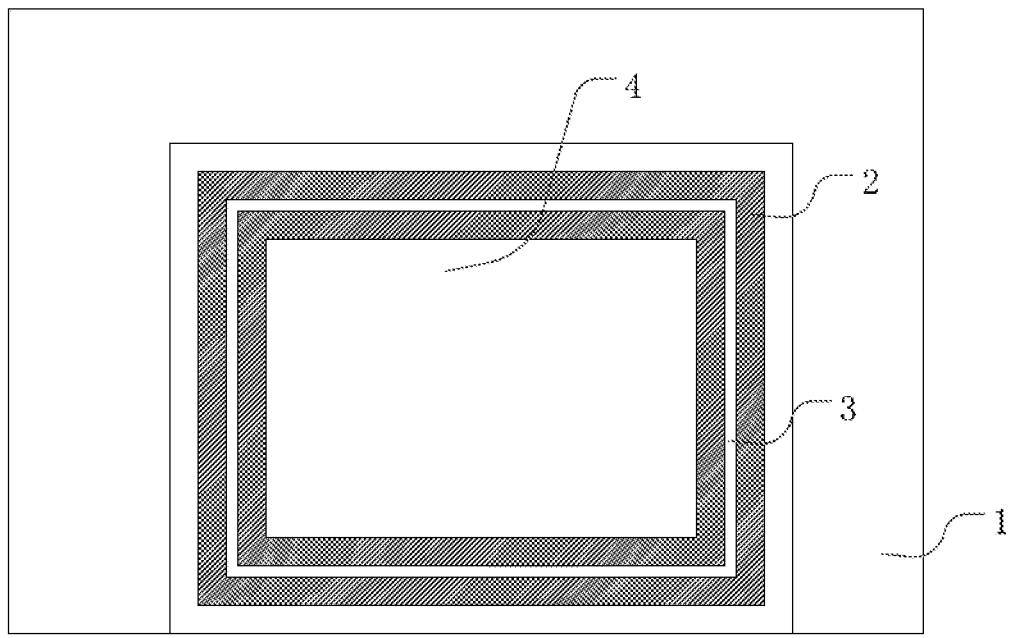
FIG. 1 is a first partial schematic diagram of a substrate of a liquid crystal display (LCD) panel according to an embodiment of the present disclosure.

Where: 1. Substrate, 2. Black matrix, 3. Groove, 4. Display region, 5. Alignment layer.

DETAILED DESCRIPTION

Specific structure and function details disclosed herein are only representative and are used for the purpose of describing exemplary embodiments of the present application. However, the present application may be specifically achieved in many alternative forms and shall not be interpreted to be only limited to the embodiments described herein.

It should be understood in the description of the present application that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present application and the simplification of the description rather than to indicate or imply that the indicated device or element must have a specific direction or constructed and operated in a specific direction, and therefore, shall not be understood as a limitation to the present application. In addition, the terms such as "first" and "second" are only used for the purpose of description, rather than being understood to indicate or imply relative importance or hint the number of indicated technical features. Thus, the feature limited by "first" and "second" can explicitly or impliedly comprise one or more features. In the description of the present application, the meaning of "a plurality of" is two or more unless otherwise specified. In addition, the term "comprise" and any variant are intended to cover non-exclusive inclusion.

It should be noted in the description of the present application that, unless otherwise specifically regulated and defined, terms such as "installation," "bonded," and "bonding" shall be understood in broad sense, and for example, may refer to fixed bonding or detachable bonding or integral bonding; may refer to mechanical bonding or electrical bonding; and may refer to direct bonding or indirect bonding through an intermediate medium or inner communication of two elements. For those of ordinary skill in the art, the meanings of the above terms in the present application may be understood according to concrete conditions.

The terms used herein are intended to merely describe concrete embodiments, not to limit the exemplary embodiments. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

The present application will be further described in detail below in combination with the drawings and preferred embodiments.

As shown in FIG. 1 to FIG. 4, embodiment of the present disclosure provides a liquid crystal display (LCD) panel, an LCD apparatus, and a method for manufacturing same.

The LCD panel comprises an array substrate and a color filter substrate arranged opposite to each other, wherein the array substrate is connected to the color filter substrate through a sealant. Liquid crystals and photo spacer (PS) are positioned between the array substrate and the color filter substrate. The array substrate is configured to TFTs and a color filter layer, and the color filter layer, the liquid crystals, the PS, and the TFTs are arranged in the sealant.

When color resistors (RGB: red, green, blue) of the color filter layer and the PS are disposed on the array substrate, the color filter substrate only has the black matrix, and the alignment layer does not have the color resistors and the PS to shield when the alignment layer are coated on the display region. Therefore, accuracy of the alignment layer cannot be controlled, and the alignment layer may overlap with the sealant, which affects cell quality.

Figure 2:
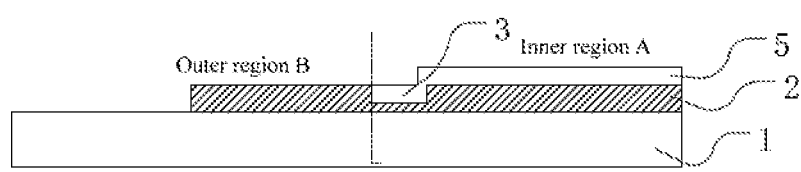
FIG. 2 is a first schematic diagram of a partial side of the substrate of the LCD panel according to the embodiment of the present disclosure.

FIG. 1 and FIG. 2 are partial schematic diagrams of a color filter substrate of the LCD panel according to an embodiment of the present disclosure. The color filter substrate of the embodiment comprises a substrate 1, a black matrix 2, an alignment layer 5, and at least one groove 3, where the black matrix 2 is disposed on the substrate 1, the alignment layer 5 is disposed on the black matrix 2, the groove 3 is disposed on the black matrix 2, the groove 3 is arranged around the alignment layer 5, the sealant is arranged on an outside of the groove 3. Material of the substrate 1 may be glass, plastic, etc.

The groove 3 is disposed on the black matrix 2 of the embodiment, the groove 3 is arranged around the alignment layer 5, the groove 3 also is arranged around a display region 4, and the sealant is arranged on the outside of the groove 3, which prevents diffusion of the alignment layer 5 according to feature of the groove 3, avoids overlap of the alignment layer 5 and the sealant, improves cell quality, and precisely controls the alignment layer 5, further avoiding waste of alignment material forming the alignment layer 5, saving costs, and improving the LCD panel quality.

The groove 3 of the embodiment is a blind groove. A bottom of the groove is in contact with the black matrix 2 without additional shading process, which avoids light leakage, and saves manufacturing process and production time. It should be understood that the groove 3 is a through groove.

The groove 3 of the embodiment is continuous and surrounds the alignment layer 5, which better limits the diffusion of the alignment material. It should be understood that a number of the groove is at least two. A plurality of the grooves 3 are arranged around the alignment 5 at intervals. A plurality of the grooves 3 can be arranged at four directions (up, down, left, right) of the display region. A plurality of the grooves 3 are arranged at the diffusion placement of the alignment material, which can prevent the diffusion of the alignment material. The groove does not have corners, which is easy to manufacture the groove and simplify process.

Figure 4:
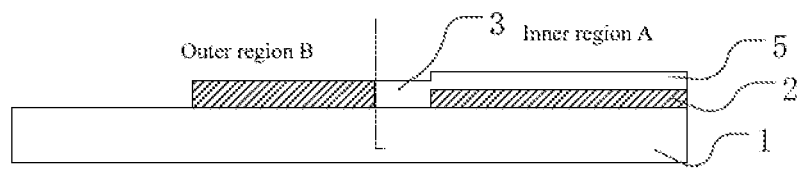
FIG. 4 is a third schematic diagram of the partial side of the substrate of the LCD panel according to the embodiment of the present disclosure.

As another embodiment of the present disclosure, FIG. 1 and FIG. 4 are partial structural diagrams of the substrate of the LCD panel according to the embodiment of the present disclosure. The color filter substrate of the embodiment comprises: the substrate 1, the black matrix 2, the alignment layer 5 and the groove 3, where the black matrix 2 is disposed on the substrate 1, the alignment layer 5 is disposed on the black matrix 2, the groove 3 is disposed on the black matrix 2, the groove 3 is arranged around the alignment layer 5, the sealant is arranged on an outside of the groove 3. Material of the substrate 1 may be glass, plastic, etc.

The groove 3 is a through groove, namely the groove 3 penetrates through the black matrix 2. A bottom of the grove is in contact with the substrate 1, which simplifies process. The alignment material is filled in groove 3, and a shading layer is disposed on an opening of the groove 3. The bottom of the groove is in contact with the substrate 1, which causes light leakage because of the groove penetrating through the black matrix 2, and needs to use the shading layer to shade light to avoid the light leakage. Furthermore, the shading layer is a black sealant, which can be manufactured with manufacturing process of the sealant without additional equipment, further simplifying operation.

The groove 3 of the embodiment is continuous and surrounds the alignment layer 5, which better limits the diffusion of the alignment material. It should be understood that a number of the groove is at least two. A plurality of the grooves 3 are arranged around the alignment layer 5 at intervals. A plurality of the grooves 3 can be arranged at four directions (up, down, left, right) of the display region. A plurality of the grooves 3 are arranged at the diffusion placement of the alignment material, which can prevent the diffusion of the alignment material. The groove does not have corners, which is easy to manufacture the groove and simplify process.

The groove 3 is the through groove disposed on the black matrix. The groove is arranged around the alignment layer 5, and also is arranged around the display region 4. The sealant is arranged on the outside of the groove 3, which prevents diffusion of the alignment layer 5 according to feature of the groove 3. Depth of the through groove is great, and the through groove can accommodate more alignment material, which avoids overlap of the alignment layer 5 and the sealant, improves cell quality, and precisely controls the alignment layer 5, further avoiding waste of alignment material forming the align rent layer 5, saving costs, and improving quality of the LCD panel.

Figure 5:
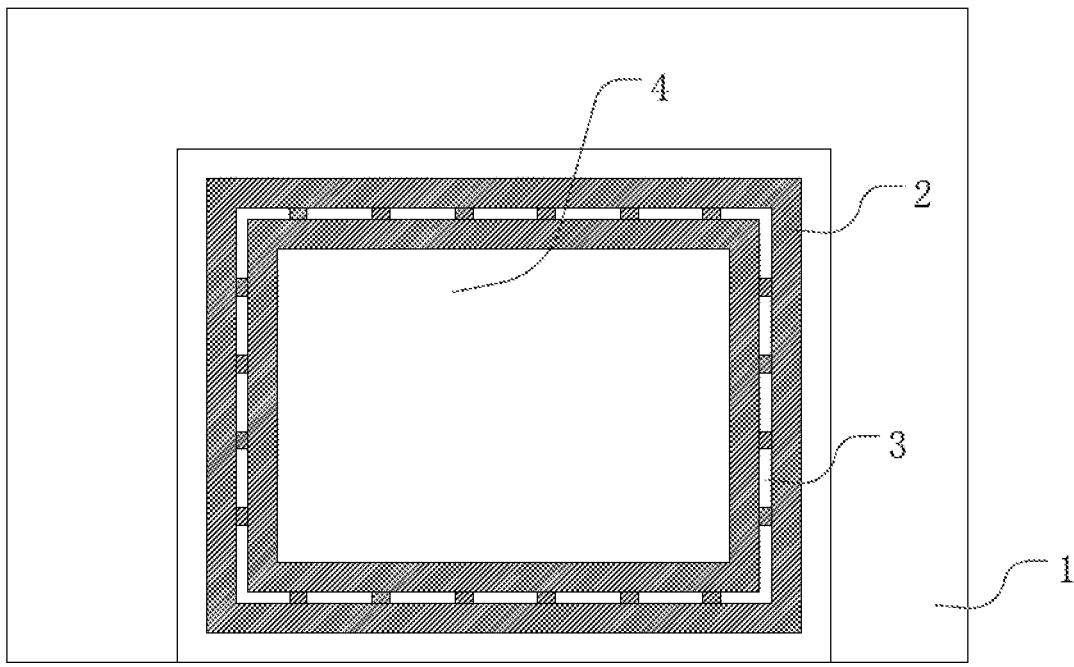
FIG. 5 is a second partial schematic diagram of the substrate of the LCD panel according to an embodiment of the present disclosure.

As another embodiment of the present disclosure, FIG. 2 and FIG. 5 are partial structural diagrams of the color filter substrate of the LCD panel according to the embodiment of the present disclosure. The color filter substrate of the embodiment comprises: the substrate 1, the black matrix 2, the alignment layer 5, and the groove 3, where the black matrix 2 is disposed on the substrate 1, the alignment layer 5 is disposed on the black matrix 2, the groove 3 is disposed on the black matrix 2, the groove 3 is arranged around the alignment layer 5, the sealant is arranged on an outside of the groove 3. Material of the substrate 1 may be glass, plastic, etc.

A number of the groove is at least two. A plurality of the grooves 3 are arranged around the alignment layer 5 at intervals. A plurality of the grooves 3 can be arranged at four directions (up, down, left, right) of the display region. A plurality of the grooves 3 are arranged at the diffusion placement of the alignment material, which can prevent the diffusion of the alignment material. The groove does not have corners, which is easy to manufacture the groove and simplify process. The groove 3 also can be as the above embodiment that the groove is continuous and surrounds the alignment layer 5.

The groove 3 of the embodiment is a blind groove. A bottom of the groove is in contact with the black matrix 2 without extra shading process, which avoids the light leakage, and saves manufacturing process and production time. It should be understood that the groove 3 is the through groove.

The groove 3 is the blind groove disposed on the black matrix. The groove is arranged around the alignment layer 5 at intervals, and also is arranged around the display region 4 at intervals. The sealant is arranged on the outside of the groove 3, which prevents diffusion of the alignment layer 5 according to the feature of the groove 3, avoids the overlap of the alignment layer 5 and the sealant, improves cell quality, and precisely controls the alignment layer 5, further avoiding waste of alignment material forming the alignment layer 5, saving costs, and improving quality of the LCD panel.

As another embodiment of the present disclosure, FIG. 4 and FIG. 5 are partial structural diagrams of the color filter substrate of the LCD panel according to the embodiment of the present disclosure. The color filter substrate of the embodiment comprises: the substrate 1, the black matrix 2, the alignment layer 5, and the groove 3, where the black matrix 2 is disposed on the substrate 1, the alignment layer 5 is disposed on the black matrix 2, the groove 3 is disposed on the black matrix 2, the groove 3 is arranged around the alignment layer 5, the sealant is arranged on an outside of the groove 3. Material of the substrate 1 may be glass, plastic, etc.

A number of the groove is at least two. A plurality of the grooves 3 are arranged around the alignment layer 5 at intervals. A plurality of the grooves 3 can be arranged at four directions (up, down, left, right) of the display region. A plurality of the grooves 3 are arranged at the diffusion placement of the alignment material, which can prevent the diffusion of the alignment material. The groove does not have corners, which is easy to manufacture the groove. The groove 3 also can be as the above embodiment that the groove is continuous and surrounds the alignment layer 5.

The groove 3 is the through groove, namely the groove 3 penetrates through the black matrix 2. A bottom of the groove is in contact with the substrate 1, which simplifies process. The alignment material is filled in groove 3, and the shading layer is disposed on an opening of the groove 3. The bottom of the groove is in contact with the substrate 1, which causes the light leakage because of the groove penetrating through the black matrix 2, and needs to use the shading layer to shade light to avoid the light leakage. Furthermore, the shading layer is the black sealant, which can be manufactured with manufacturing process of the sealant without additional equipment, further simplifying operation.

The groove 3 is the through groove disposed on the black matrix. The groove is arranged around the alignment layer 5 at intervals, and also is arranged around the display region at intervals. The sealant is arranged on the outside of the groove 3, which prevents diffusion of the alignment layer 5 according to feature of the groove 3, avoids overlap of the alignment layer 5 and the sealant, improves cell quality, and precisely controls the align lent layer 5, further avoiding waste of alignment material forming the alignment layer 5, saving costs, and improving quality of the LCD panel.

Figure 3:
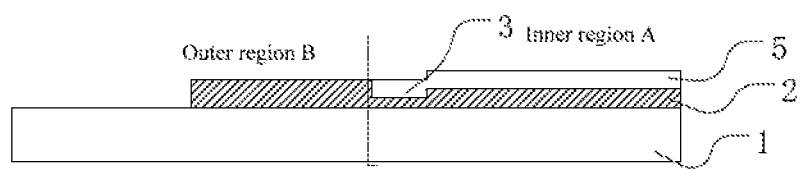
FIG. 3 is a second schematic diagram of the partial side of the substrate of the LCD panel according to the embodiment of the present disclosure.

As another embodiment of the present disclosure, FIG. 1, FIG. 3, and FIG. 5 are partial structural diagrams of the color filter substrate of the LCD panel according to the embodiment of the present disclosure. The color filter substrate of the embodiment comprises: the substrate 1, the black matrix 2, the alignment layer 5 and the groove 3, where the black matrix 2 is disposed on the substrate 1, the alignment layer 5 is disposed on the black matrix 2, the groove 3 is disposed on the black matrix 2, the groove 3 is arranged around the alignment layer 5, the sealant is arranged on the outside of the groove 3. Material of the substrate 1 may be glass, plastic, etc.

The black matrix 2 comprises an inner region and an outer region. The inner region is connected to the outer region through the groove 3, and the alignment layer 5 is disposed on the inner region, a height of the outer region is greater than a height of the inner region. The alignment material is not easy to diffuse from the inner region to the outer region, which prevents the diffusion of the alignment layer 5, and avoids the overlap of the alignment layer 5 and the sealant.

The groove 3 of the embodiment is a blind groove. The bottom of the groove is in contact with the black matrix 2 without additional shading process, which avoids light leakage, and saves manufacturing process and production time.

The groove 3 of the embodiment is continuous and surrounds the alignment layer 5, which better limits the diffusion of the alignment material. It should be understood that a number of the groove is at least two. A plurality of the grooves 3 are arranged around the alignment 5 at intervals. A plurality of the grooves 3 can be arranged at four directions (up, down, left, right) of the display region. A plurality of the grooves 3 are arranged at the diffusion placement of the alignment material, which can prevent the diffusion of the alignment material. The groove does not have corners, which is easy to manufacture the groove.

The groove 3 is the through groove disposed on the black matrix 2. The groove 3 is arranged around the alignment layer 5, and also is arranged around the display region 4. The sealant is arranged on the outside of die groove 3, which prevents diffusion of the alignment layer 5 according to the feature of the groove 3, and avoids overlap of the alignment layer 5 and the sealant. The black matrix 2 comprises the inner region and the outer region, where heights of the inner region and the outer region are different, and the height of the outer region is greater than the height of the inner outer. The alignment layer 5 is disposed on the inner region, and the alignment material is not easy to diffuse from the inner region to the outer region, which improves cell quality, and precisely controls the alignment layer 5, further avoiding waste of alignment material forming the alignment layer 5, saving costs, and improving the LCD panel quality.

As another embodiment of the present disclosure, FIG. 1, FIG. 4, and FIG. 5 are partial structural diagrams of the color filter substrate of the LCD panel according to the embodiment of the present disclosure. The color filter substrate of the embodiment comprises: the substrate 1, the black matrix 2, the alignment layer 5 and the groove 3, where the black matrix 2 is disposed on the substrate 1, the alignment layer 5 is disposed on the black matrix 2, the groove 3 is disposed on the black matrix 2, the groove 3 is arranged around the alignment layer 5, the sealant is arranged on an outside of the groove 3. Material of the substrate 1 may be glass, plastic, etc.

The black matrix 2 comprises an inner region and an outer region. The inner region is connected to the outer region through the groove 3, and the alignment layer 5 is disposed on the inner region, a height of the outer region is greater than a height of the inner region. The alignment material is not easy to diffuse from the inner region to the outer region, which prevents the diffusion of the alignment layer 5, and avoids the overlap of the alignment layer 5 and the sealant.

The groove 3 is the through groove, namely the groove 3 penetrates through the black matrix 2. A bottom of the groove is in contact with the substrate 1, which simplifies process. The alignment material is filled in groove 3, and the shading layer is disposed on the opening of the groove 3. The bottom of the groove is in contact with the substrate 1, which causes the light leakage because of the groove penetrating through the black matrix 2, and needs to use the shading layer to shade light to avoid the light leakage. Furthermore, the shading layer is the black sealant, which can be manufactured with manufacturing process of the sealant without additional equipment, further simplifying process.

The groove 3 of the embodiment is continuous and surrounds the alignment layer 5, which better limits the diffusion of the alignment material. It should be understood that a number of the groove is at least two. A plurality of the grooves 3 are arranged around the alignment 5 at intervals. A plurality of the grooves 3 can be arranged at four directions (up, down, left, right) of the display region. A plurality of the grooves 3 are arranged at the diffusion placement of the alignment material, which can prevent the diffusion of the alignment material. The groove does not have corners, which is easy to manufacture the groove.

The groove 3 is the through groove disposed on the black matrix 2. The groove is arranged around the alignment layer 5, and also is arranged around the display region 4. The sealant is arranged on the outside of the groove 3, which prevents diffusion of the alignment layer 5 according to feature of the groove 3, and avoids overlap of the alignment layer 5 and the sealant. The black matrix 2 comprises the inner region and the outer region, where heights of the inner region and the outer region are different, and the height of the outer region is greater than the height of the inner outer. The alignment layer 5 is disposed on the inner region, and the alignment material is not easy to diffuse from the inner region to the outer region, which improves cell quality, and precisely controls the alignment layer 5, further avoiding waste of alignment material forming the alignment layer 5, saving costs, and improving quality of the LCD panel.

As another embodiment of the present disclosure, the embodiment provides the LCD apparatus, where the LCD apparatus comprises a housing. The backlight module, and the LCD panel and a control circuit board are arranged in the housing. The backlight module provides light source for the LCD panel and the control circuit board provides display signal for the LCD panel, the LCD panel is regarded as the LCD panel of the above embodiment, therefore, specific structure and connected relationship of the LCD panel are shown in FIG. 1 to FIG. 5, there is no detailed description.

Figure 6:
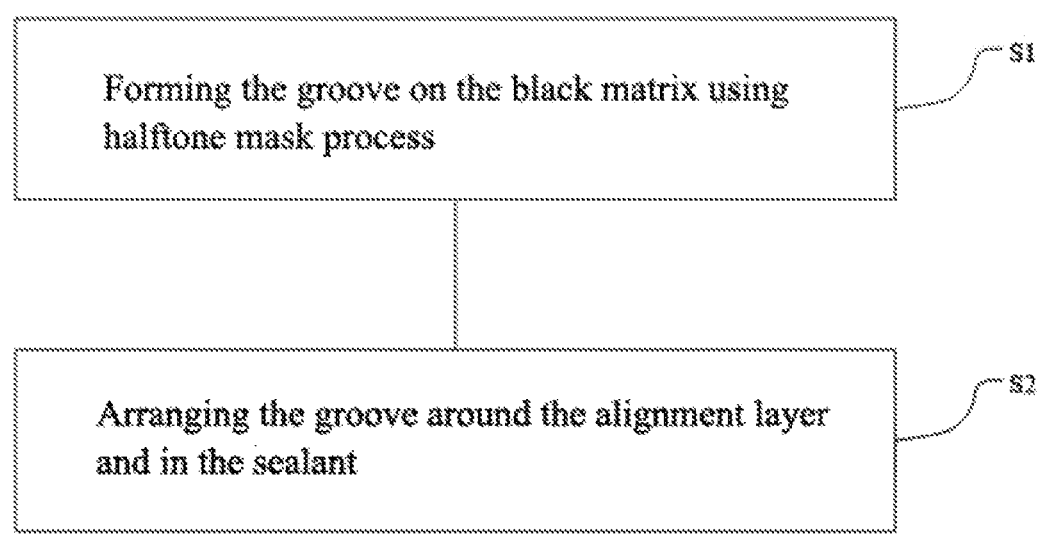
FIG. 6 is a method for manufacturing the LCD panel according to an embodiment of the present disclosure.

As another embodiment of the present disclosure in FIG. 6, the embodiment provides a method for manufacturing the LCD panel, where the method comprises: forming the groove on the black matrix using halftone mask process, the method particularly comprises:

S1: forming the groove on the black matrix using halftone mask process; and

S2: arranging the groove around the alignment layer and in the sealant.

The groove 3 is the through groove disposed on the black matrix. The groove is arranged around the alignment layer 5, and also is arranged around the display region 4. The sealant is arranged on the outside of the groove 3, which prevents diffusion of the alignment layer 5 according to feature of the groove 3, avoids overlap of the alignment layer 5 and the sealant, improves cell quality, and precisely controls the alignment layer 5, further avoiding waste of alignment material forming the alignment layer 5, saving costs, and improving the LCD panel quality.

The groove is formed on the black matrix using the halftone mask process, and the groove can be the through groove and also be the blind groove. The groove 3 is a blind groove, and the bottom of the groove is in contact with the black matrix 2 without extra shading process, which avoids light leakage, and saves manufacturing process and production time. It should be understood that the groove 3 is the through groove, namely the groove 3 penetrates through the black matrix 2, and the bottom of the groove is in contact with the substrate 1, which simplifies process. The alignment material is filled in groove 3, and a shading layer is disposed on the opening of the groove 3. The bottom of the groove is in contact with the substrate 1, which causes light leakage because of the groove penetrating through the black matrix 2, and need to use the shading layer to shade to avoid the light leakage. Furthermore, the shading layer is the black sealant, which can be manufactured with manufacturing process of the sealant without additional equipment, further simplifying process.

The groove is formed on the black matrix using the halftone mask process, and the groove 3 of the embodiment is continuous and surrounds the alignment layer 5, which better limits the diffusion of the alignment material. It should be understood that a number of the groove is at least two. A plurality of the grooves 3 are arranged around the alignment layer 5 at intervals. A plurality of the grooves 3 can be arranged at four directions (up, down, left, right) of the display region. A plurality of the grooves 3 are arranged at the diffusion placement of the alignment material, which can prevent the diffusion of the alignment material. The groove does not have corners, which is easy to manufacture the groove and simplify process.

In the above embodiment, the color filter substrate comprises TFT array, where the TFT array and color filter form on a same substrate.

In the above embodiment, the LCD panel of the present disclosure can be a curved panel.

As the above, it should be understood that the present disclosure has been described with reference to certain preferred and alternative embodiments which are intended to be exemplary only and do not limit the full scope of the present disclosure as set forth in the appended claims.

The invention claimed is:

1. A liquid crystal display (LCD) panel, comprising:
a substrate;
a black matrix disposed on the substrate;
an alignment layer disposed on the black matrix; and
at least one groove disposed on the black matrix;
and wherein the black matrix comprises an inner region and an outer region; the inner region is connected with the outer region via the at least one groove, the alignment layer is disposed on the inner region, and a height of the outer region is greater than a height of the inner region;
a thickness of the black matrix in the outer region is greater than a thickness of the black matrix in the inner region; and
the at least one groove comprises a first side wall and a second side wall, a height of the first side wall is greater than a height of the second side wall.

2. The LCD panel according to claim 1, wherein the groove penetrates through the black matrix, and a bottom of the groove is in contact with the substrate; and the alignment layer directly contact with the substrate via the groove.

3. The LCD panel according to claim 1, wherein the groove is continuous and surrounds the alignment layer.

4. The LCD panel according to claim 1, wherein a number of the groove is at least two, and a plurality of the grooves are arranged around the alignment layer at intervals.

5. The LCD panel according to claim 4, wherein the grooves comprise four sets of first groove groups and four second grooves, and each sets of the first groove groups includes a plurality of first grooves, the plurality of first grooves extend in the same direction and at intervals, four sets of the first groove groups respectively extending along the four edge directions of the liquid crystal panel;
each of the second grooves is L-shaped, and the second grooves are respectively provided with corner positions where two adjacent sets of the first grooves joint.

6. The LCD panel according to claim 5, wherein the LCD panel comprises two long sides and two short sides, and length of the long side is longer than length of the short side; five of the first grooves are provided on each of the first groove groups on the long side, and three of the first grooves are provided on each of the short groove sides.

7. The LCD panel according to claim 1, wherein a bottom of the groove is the black matrix, a height of the black matrix corresponding to the bottom of the black matrix is less than a height of the black matrix in the inner region, a height of the surface of the black matrix on the bottom of the groove is higher than a height of the surface of the substrate.

8. A liquid crystal display (LCD) apparatus, comprising an LCD panel, and the LCD panel comprises:
a substrate;
a black matrix disposed on the substrate,
an alignment layer disposed on the black matrix; and
at least one groove disposed on the black matrix;
and wherein the black matrix comprises an inner region and an outer region; the inner region is connected with the outer region via the at least one groove, the alignment layer is disposed on the inner region, and a height of the outer region is greater than a height of the inner region;
a thickness of the black matrix in the outer region is greater than a thickness of the black matrix in the inner region; and
the at least one groove comprises a first side wall and a second side wall, a height of the first side wall is greater than a height of the second side wall.

9. The LCD apparatus according to claim 8, wherein the groove penetrates through the black matrix, and a bottom of the groove is in contact with the substrate; and the alignment layer directly contact with the substrate via the groove.

10. The LCD apparatus according to claim 8, wherein the groove is continuous and surrounds the alignment layer.

11. The LCD apparatus according to claim 8, wherein a number of the groove is at least two, and a plurality of the grooves are arranged around the alignment layer at intervals.

12. The LCD apparatus according to claim 11, wherein the grooves include four sets of first groove groups and four second grooves, and each sets of the first groove groups comprises a plurality of first grooves, the plurality of first grooves extend in the same direction and at intervals, four sets of the first groove groups respectively extending along the four edge directions of the liquid crystal panel;
each of the second grooves is L-shaped, and the second grooves are respectively provided with corner positions where two adjacent sets of the first grooves joint.

13. The LCD apparatus according to claim 12, wherein the LCD panel comprises two long sides and two short sides, and length of the long side is longer than length of the short side; five of the first grooves are provided on each of the first groove groups on the long side, and three of the first grooves are provided on each of the short groove sides.

14. A method for manufacturing a liquid crystal display (LCD) panel, comprising:
forming a substrate;
arranging a layer of the black matrix on the substrate;
arranging a alignment layer on the black matrix;
forming the groove on the black matrix using halftone mask process;

arranging the sealant on the outside of the groove and wherein the black matrix comprises an inner region and an outer region; the inner region is connected with the outer region via the at least one groove, the alignment layer is disposed on the inner region, and a height of the outer region is greater than a height of the inner region;

a thickness of the black matrix in the outer region is greater than a thickness of the black matrix in the inner region; and the at least one groove comprises a first side wall and a second side wall, a height of the first side wall is greater than a height of the second side wall.

* * * * *